(12) United States Patent
Hatori et al.

(10) Patent No.: US 6,252,452 B1
(45) Date of Patent: Jun. 26, 2001

(54) SEMICONDUCTOR DEVICE

(75) Inventors: Fumitoshi Hatori, Yokohama; Tetsuya Fujita, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/382,010

(22) Filed: Aug. 24, 1999

(30) Foreign Application Priority Data

Aug. 25, 1998 (JP) .................................................. 10-239195

(51) Int. Cl.$^7$ ....................................................... G05F 1/10
(52) U.S. Cl. ............................................ 327/544; 327/545
(58) Field of Search ..................................... 327/544, 545, 327/546, 534, 535, 537

(56) References Cited

U.S. PATENT DOCUMENTS

| | | | |
|---|---|---|---|
| 4,631,421 | 12/1986 | Inoue et al. | 327/537 |
| 4,864,373 | 9/1989 | Miyashita | 357/23 |
| 4,873,668 | 10/1989 | Winner et al. | 327/530 |
| 5,545,934 | 8/1996 | Reddy et al. | 307/130 |
| 5,909,140 | * 6/1999 | Choi | 327/534 |
| 6,046,627 | * 4/2000 | Itoh et al. | 327/546 |
| 6,097,113 | * 8/2000 | Teraoka et al. | 327/534 |

OTHER PUBLICATIONS

Howard C. Kirsch et al., "Megabit DRAMs", ISSCC 85, Friday, Feb. 15, 1985.

* cited by examiner

Primary Examiner—Toan Tran
Assistant Examiner—Linh Nguyen
(74) Attorney, Agent, or Firm—Hogan & Hartson, LLP

(57) ABSTRACT

In a semiconductor device operating upon receiving two power supply potentials (VDD1, VDD2) (VDD1<VDD2), the two power supplies must be simultaneously turned on, or the power supply (VDD2) must be turned on earlier than the power supply (VDD1). A substrate bias circuit for generating a substrate bias voltage operates upon receiving the power supply potential (VDD2) but cannot generate a stable substrate bias voltage before a certain time elapses after turning on the power supply (VDD2). If the power supply (VDD1) is turned on during this period, latch-up may occur.

To prevent this, before a predetermined period from the time of power-on elapses, including a period after the power supply (VDD2) is turned on until the power supply VDD1 is turned on, transistors (MN1, MN2, MP1, MP2) are operated under the control of a reset circuit (14) to connect an N-well (11) to the power supply voltage (VDD2) terminal and a P-well (12) to a ground voltage (VSS) terminal. This arrangement prevents latch-up due to floating of the substrate potential. After the predetermined period elapses, all the transistors are turned off under the control of the reset circuit (14), so bias voltages of appropriate polarities are applied to the N-well (11) and P-well (12).

18 Claims, 15 Drawing Sheets

TIME LAG IN POWER-ON

SEMICONDUCTOR DEVICE

BACKGROUND OF THE INVENTION

The present invention relates to semiconductor devices and, more particularly, to CMOS semiconductor devices in which bias voltages different from the power supply potential and ground potential are applied to the substrates.

In CMOS semiconductor devices, to reduce the power consumption while maintaining high-speed operation, integrated circuits are designed using field effect transistors with low threshold voltages and low supply voltages.

In some devices, to decrease the current in the stand-by state of the circuit, i.e., so-called leakage current, or to compensate for variations in the threshold voltages during the operation of the circuit, substrate bias voltages different from the power supply potential and ground potential are applied.

In such devices, the lines for applying the substrate or well potential are not connected to the power supply lines or the ground line. For this reason, during the power on sequence when the operation of the substrate potential control circuit is still unstable, latch-up could occur because the power supply voltage could become higher than the substrate potential. To prevent this, each substrate is connected with an appropriate potential until a predetermined time period from the onset of the power-on elapses.

However, when the device has a plurality of the supply voltages, latch-up occurs during the power-on process, as will be described later.

SUMMARY OF THE INVENTION

It is therefore an object of the present invention to provide a semiconductor device capable of preventing latch-up during the power-on period.

According to the present invention, there provided a semiconductor device in which a plurality of elements each operating upon receiving one of at least two power supplies are formed on substrates, and the lines for applying potential to the substrates are separated into a first potential line and a second potential line in accordance with the conductivity types of the substrates, comprising a potential connection means which connect the first and second potential lines with the power supply potential highest in the power supplies or the ground potential, respectively, in accordance with the conductivity type of the substrates until a predetermined period elapses, including the period after one of the power supplies is turned on prior to any other supplies until all the remaining power supplies are turned on.

The potential connection means may comprise a substrate bias circuit, the substrate bias circuit may generate a first substrate bias voltage high than the power supply potential and a second substrate bias voltage lower than the ground potential, and the potential connection means may connect the substrates with the power supply potential highest in the power supplies and the ground potential in accordance with the conductivity types of the substrates until the predetermined period elapses, including the period after one of the power supplies is turned on prior to any other supplies until all the remaining power supplies are turned on, and apply one of the first substrate bias voltages and the second substrate bias voltage to the semiconductor substrates in accordance with the conductivity type of the substrate after the predetermined period elapses.

The power supplies may include first power supplies and a second power supply having a voltage higher than those of the first power supplies, the second power supply potential may be applied to the substrate bias circuit, and the predetermined period may include a period after the second power supply is turned on until the first power supplies are turned on.

The potential connection means may comprise a reset circuit for measuring the predetermined period, the reset circuit may comprise an oscillator for generating clocks, and a counter for counting the clocks and outputting a reset signal of a first level when the count value reaches a predetermined value, and the potential connection means may connect the substrate with one of the power supply potential highest in the power supplies and the ground potential in accordance with the conductivity type of the substrates while the reset signal from the counter is a second level after one of the power supplies is turned on prior to any other supplies, and apply one of the first substrate bias voltages and the second substrate bias voltage to the semiconductor substrates in accordance with the conductivity type of the substrates after the reset signal from the counter becomes the first level.

The oscillator may have an enable terminal, which outputs the clocks while the enable signal is at the second level, and stops the generation of the clocks when the enable signal changes to the first level.

The oscillator preferably comprises a ring oscillator in which an odd number of inverters with a Schmitt trigger function are connected.

According to the present invention, there also provided a semiconductor device comprising first conductive substrate on which a plurality of elements each connected to one of at least two power supplies are formed, and a second conductive substrate on which elements connected to a ground potential are formed, a substrate bias circuit for generating the first and second substrate bias voltages to be applied to the first conductive substrate and the second conductive substrate, respectively, a first switching element connected between the first conductive substrate and a first potential lines, a second switching element connected between the second conductive substrate and a second potential line, and a reset circuit for controlling the first and second switching elements such that, before a predetermined period elapses, including the period after one of the power supplies is turned on prior to any other supplies until all the remaining power supplies are turned on, the first conductive substrates are connected to the first potential lines to fix the first conductive substrate at a first potential and the second conductive substrates are connected to the second potential line to fix the second conductive substrate at a second potential, and after the predetermined period elapses, the first conductive substrates are disconnected from the first potential line and the second conductive substrate is disconnected from the second potential line to apply the first and second substrate bias voltages to the first conductive substrates and the second conductive substrate, respectively.

According to the present invention, there also provided a semiconductor device comprising n-type substrates on which a plurality of elements each connected to one of at least two power supplies are formed, and a p-type substrate on which elements connected to a ground potential are formed, a substrate bias circuit for generating first and second substrate bias voltages to be applied to the n-type substrates and the p-type substrate, respectively, first diodes having the anodes connected to first output terminals of the substrate bias circuit, which supplies the first substrate bias voltages, and the cathodes connected to the n-type substrates, a second diode having the cathode connected to a second output terminal of the substrate bias circuit, which supplies the second substrate bias voltage, and the anode connected to the p-type substrate, first PMOS transistors having sources and drains connected between a power supply line of a first power supply included in the power supplies and the n-type substrates, and the gate connected to the first output terminal, a first NMOS transistor having a source and a drain connected between the p-type substrate and the ground line, and the gate connected to the second output terminal, second NMOS transistors having drains and sources connected between the gates of the first PMOS transistors and the ground lines, a second PMOS transistor having the drain and the source connected between the gate of the first NMOS transistor and the power supply line, and a reset circuit for controlling gate voltages of the second NMOS transistors and the second PMOS transistor to control operation of the second NMOS transistor and the second PMOS transistor, until a predetermined period elapses, including a period after one of the power supplies is turned on prior to any other supplies until all the remaining power supplies are turned on, the reset circuit turns on the second NMOS transistors and the second PMOS transistors to turn on the first NMOS transistor and the first PMOS transistors, thereby connecting the n-type substrates to one of the power supply line and connecting the p-type substrate to the ground line, and after the predetermined period elapses, the reset circuit turns off the second NMOS transistors and the second PMOS transistors to supply the first and second substrates bias voltages to the gates of the first NMOS transistor and the first PMOS transistors, thereby disconnecting the n-type substrate from the power supply line and disconnecting the p-type substrate from the ground line such that the first and second substrate bias voltages are applied to the n-type substrates and the p-type substrate via the first and second diodes, respectively.

According to the present invention, there also provided a semiconductor device comprising an n-type substrate on which a plurality of elements each connected to one of at least two power supplies are formed, and a p-type substrate on which elements connected to a ground potential are formed, a substrate bias circuit connected to the n-type substrates and the p-type substrate to generate first and second substrate bias voltages to be applied to the n-type substrates and the p-type substrate, respectively, first PMOS transistors having sources and drains connected between a power supply line of a first power supply included in the power supplies and the n-type substrates, a first NMOS transistor having a source and drain connected between a ground line and the p-type substrate, second NMOS transistors having drains and sources connected between gates of the first PMOS transistors and the ground line, a second PMOS transistor having a drain and a source connected between the gate of the first NMOS transistors and the power supply line, a reset circuit for controlling gate voltages of the second NMOS transistors and the second PMOS transistor to control operation of the second NMOS transistors and the second PMOS transistor, and a charge pump whose operation is controlled by the reset circuit and which is connected to the gates of the first NMOS transistors and the first PMOS transistors, until a predetermined period elapses, including the period after one of the power supplies is turned on prior to any other supplies until all the remaining power supplies are turned on, the reset circuit turns on the second NMOS transistors and the second PMOS transistor and disable the charge pump to turn on the first NMOS transistor and the first PMOS transistor, thereby connecting the n-type substrate to the power supply line and connecting the p-type substrate to the ground line, and after the predetermined period elapses, the reset circuit turns off the second NMOS transistor and the second PMOS transistor and enables the charge pump to turn off the first NMOS transistors and the first PMOS transistors, thereby disconnecting the n-type substrates from the power supply line and disconnecting the p-type substrates from the ground line such that the first and second substrate bias voltages are applied to the n-type substrates and the p-type substrate, respectively.

The reset circuit may comprise an oscillator, start counting the number of clocks from the oscillator after one of the power supplies is turned on prior to any other supplies, generate reset signals for turning on the second NMOS transistors and the second PMOS transistor until the number of clocks corresponding to the predetermined period is counted, and invert the reset signals for turning off the second NMOS transistors and the second PMOS transistor after the number of clocks is counted.

The oscillator may have an enable terminal which is connected to one of the reset signals, and while the reset signals turn on the second NMOS transistors and the second PMOS transistor, the clocks may be generated, and when the reset signals turn off the second NMOS transistors and the second PMOS transistor, the output of the clocks may be stopped, thereby preventing excess power consumption except a component due to the leakage current after the predetermined period elapses.

The oscillator may comprise a ring oscillator in which an odd number of inverters with a Schmitt trigger function are connected.

The reset circuit may comprise an oscillator having an enable terminal, a counter, and a flip-flop, and after one of the power supplies is turned on, the flip-flop may hold internal data corresponding to the input signal to the enable terminal of the oscillator and the output signals from the reset circuit, and the counter may count the number of clocks from the oscillator and change the output upon counting the number of clocks corresponding to the predetermined period to invert the internal data held in the flip-flop, invert the output signals from the reset circuit, and invert the input signal to the enable terminal of the oscillation, thereby stopping operation of the oscillator, so that only power due to a leakage current is consumed after the predetermined period from the onset of the power-on, the predetermined period being determined by the oscillation frequency of the oscillator and the number of stages of the counter.

According to the semiconductor device of the present invention with the above arrangement, before the predetermined period elapses, including the period after one of the power supplies is turned on until all the remaining power supplies are turned on, the substrates are connected to the first or second potential in accordance with the conductivity types of the substrates. Consequently, latch-up due to floating potential of the substrate can be avoided.

DESCRIPTION OF THE PREFERRED EMBODIMENTS

The present invention has been made on the basis of recognition of the following problems of a conventional device.

Figure 15:
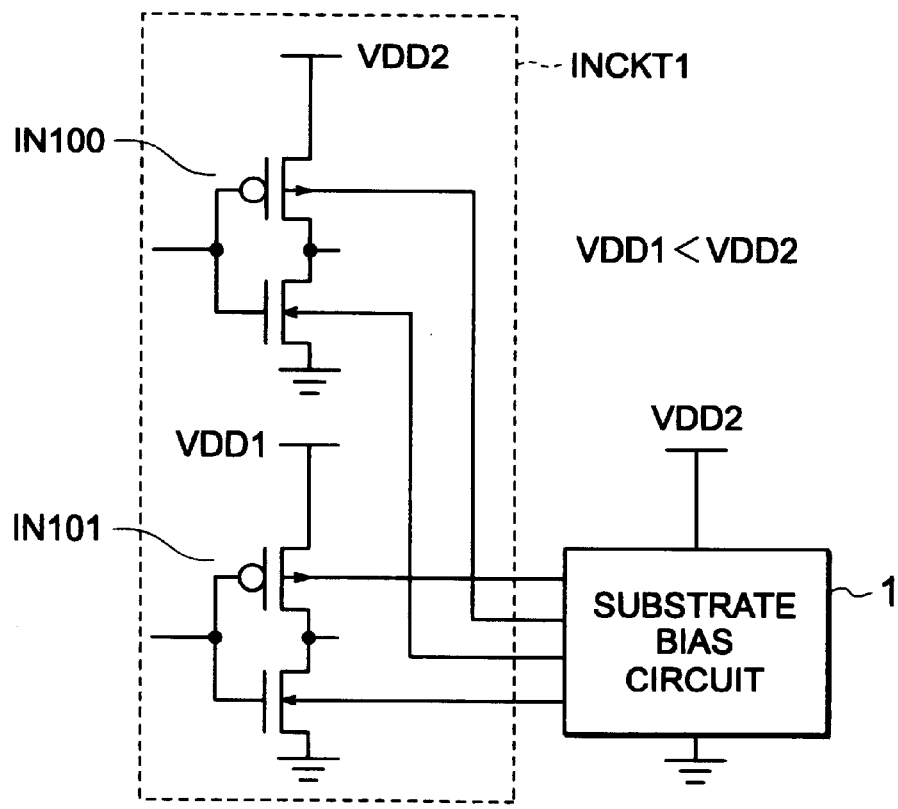
FIG. 15 is a circuit diagram showing an internal circuit which is formed on substrates applied with substrate bias voltages generated by a substrate bias circuit and has elements operated by different power supply voltages.

Assume a device having a circuit arrangement shown in FIG. 15. A substrate bias circuit 1 is applied with a power supply voltage VDD2 to generate substrate bias voltages. The substrate bias voltages generated by the substrate bias circuit 1 is applied to the substrates of a plurality of elements (inverters) IN100 and IN101 in an internal circuit INCKT1. Different power supply voltages are applied to the elements IN100 and IN101. The element IN101 is operated under a power supply voltage VDD1 different from the power supply voltage VDD2 applied to the substrate bias circuit 1.

The reason for use of different power supplies is as follows. In the internal circuit, a power supply voltage as low as possible is preferable for reduction of power consumption. In the substrate bias circuit, a power supply voltage as high as possible is preferably used to generate a substrate bias voltage necessary to change the threshold voltages sufficiently. Hence, VDD1<VDD2.

In the conventional integrated circuit, usually, the operating voltage of interface circuits for interfacing with peripheral devices outside the chip is higher than that of the internal circuits. For example, when the power supply for the interface circuits is used as the power supply for the substrate bias circuit, no special power supply need to be prepared for the substrate bias circuit.

In this integrated circuit, when the power supply VDD1 is turned on earlier than the power supply VDD2, the substrate potential of the internal circuits remains disconnected, and latch-up takes place. In the internal circuit INCKT1 shown in FIG. 15, when the power supply VDD2 is turned on later than the power supply VDD1, latch-up occurs in the element IN101.

Figure 16:
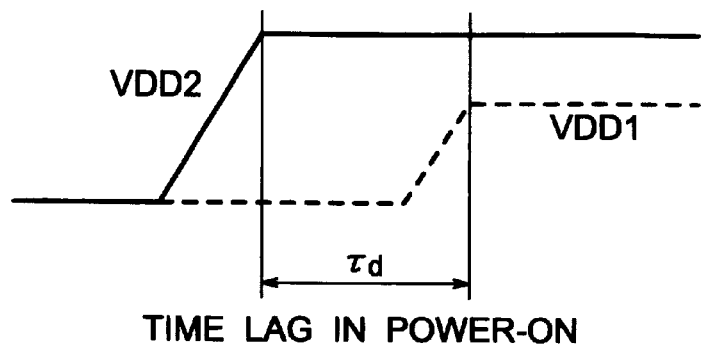
FIG. 16 is an explanatory figure showing the time lag in turning on the first and the second power supplies for supplying different power supply voltages.

To prevent the latch-up, the power supplies VDD1 and VDD2 must be simultaneously turned on, or the power supply VDD1 must be turned on later than the power supply VDD2. However, as shown in FIG. 16, when two power supplies are turned on, a time lag τd exists between those two rising edges of the supplies. The value of the time lag may normally be in the order of several tens of μsec.

In a conventional device which uses a single supply voltage for the internal circuits, to prevent latch-up, the substrates are fixed at an appropriate potential until a predetermined time that is determined by the CR time constant determined by the capacitor/resistor circuit elapses after one power supply (VDD2) is turned on.

However, to generate a delay time longer than several tens of μsec on the basis of the CR time constant, a very large capacitance and resistance are necessary. It is almost impossible to form such a CR circuit on the same semiconductor substrate due to the limited chip area.

In the embodiments of the present invention to be described below, when the substrates are fixed for a predetermined period at appropriate potentials (e.g., the power supply potential or ground potential), different from the substrate bias voltage to prevent latch-up during the power-on process, the substrates are fixed at the appropriate potentials for a sufficiently long period including the time from the time that the first power supply is provided until all the remaining power supplies are provided.

The first to seventh embodiments of the present invention will be described below with reference to the accompanying drawings.

Figure 1:
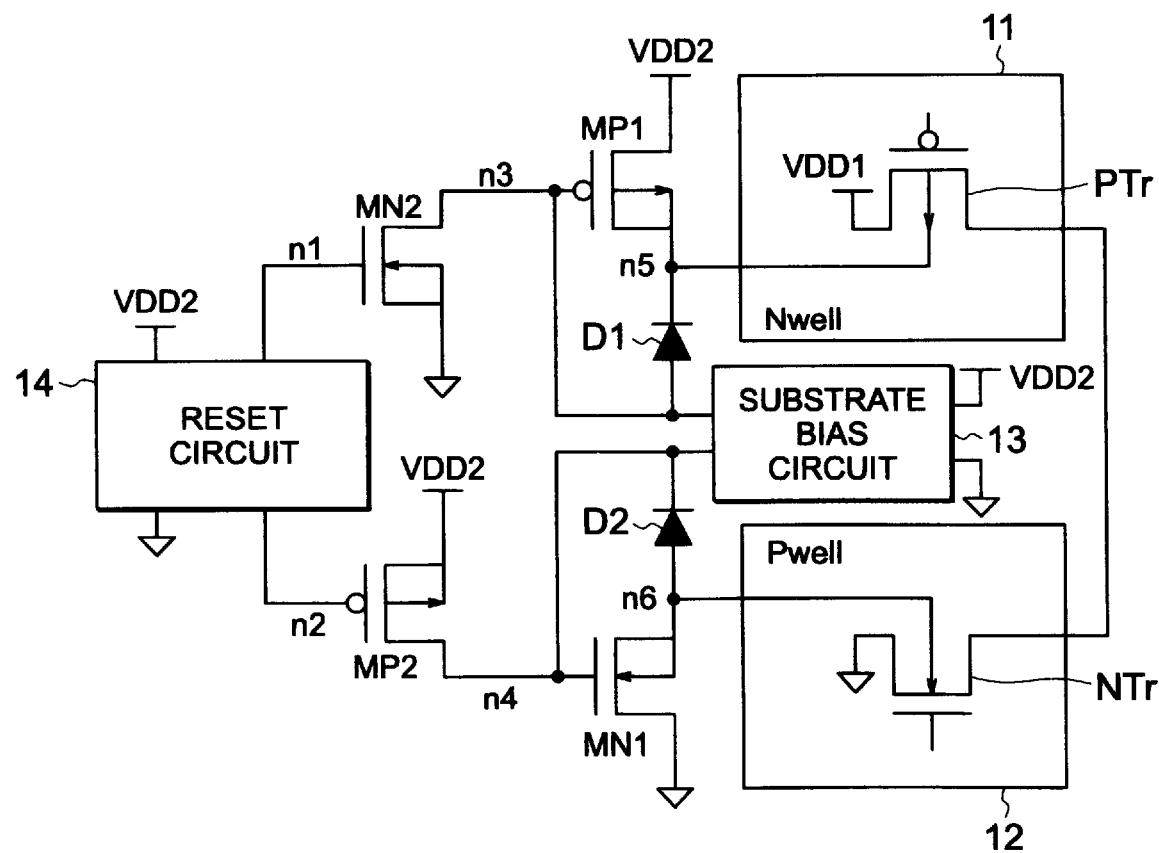
FIG. 1 is a circuit diagram showing the arrangement of a semiconductor device according to the first embodiment of the present invention.

A semiconductor device according to the first embodiment of the present invention has the arrangement shown in FIG. 1. A PMOS transistor PTr is formed on an N-well 11, and an NMOS transistor NTr is formed on a P-well 12. The transistors PTr and NTr are combined to work as an internal circuit of this device. The PMOS transistor PTr and NMOS transistor NTr are connected to each other, thereby forming a CMOS logic element.

The N-well 11 includes an N-well formed in the surface of a p-type semiconductor substrate, or a surface region of an n-type semiconductor substrate. The P-well 12 includes a P-well formed in the surface of a n-type semiconductor substrate, or a surface region of a p-type semiconductor substrate.

The node n5 connected to the N-well 11 is connected, via a diode D1, to one of the output terminal of a substrate bias circuit 13, which generates a substrate bias voltage Vsub1. The node n6 connected to the P-well 12 is connected, via a diode D2, to the other output terminal of the substrate bias circuit 13, which generates a substrate bias voltage Vsub2.

The source and drain of a PMOS transistor MP1 are connected between the terminal of a power supply voltage VDD2 and the node n5. The gate of the PMOS transistor is connected, via a node n3, to one of the terminal of the substrate bias circuit 13, which generates the substrate bias voltage Vsub1. The source and drain of an NMOS transistor MN1 are connected to the terminal of the ground voltage VSS and the node n6. The gate of the NMOS transistor is connected, via a node n4, to one of the terminal of the substrate bias circuit 13, which generates the substrate bias voltage Vsub2.

The drain and source of an NMOS transistor MN2 are connected between the node n3 and the ground voltage VSS terminal. The gate of the NMOS transistor is connected to one of the output terminals of a reset circuit 14 via a node n1. The drain and source of a PMOS transistor MP2 are connected between the node n4 and the power supply voltage VDD2 terminal. The gate of the PMOS transistor is connected to the other output terminal of the reset circuit 14 via a node n2.

The power supply VDD2 is supplied to the substrate bias circuit 13, reset circuit 14, and transistors MP1 and MP2. On the other hand, the power supply VDD1 is applied to the transistor PTr forming an element of the internal circuit. In this case, VDD1<VDD2.

The substrate bias circuit 13 generates a substrate bias voltage to be applied to the substrates of the N- and P-wells 11 and 12. When the power supply VDD2 is turned on and becomes stable, the substrate bias circuit 13 generates the substrate bias voltage Vsub1 higher than the power supply voltage VDD1 for the N-well 11 and the substrate bias voltage Vsub2 lower than the ground voltage VSS for the P-well 12.

During the period from turning on the power supply VDD2 to turning on the other power supply VDD1 and, more preferably, during a predetermined period T including the period after the power supplies VDD2 and VDD1 are sequentially turned on until both the potentials and outputs from the substrate bias circuit 13 become stable, the reset circuit 14 outputs the power supply voltage VDD2 to the output node n1 and the ground voltage VSS to the output node n2.

One of specific arrangements of the reset circuit 14 according to the first embodiment will be described next. As described above with reference to FIG. 16, since the two power supplies VDD1 and VDD2 are used, there must be a restriction to the timings of applying these supplies. To prevent latch-up, turning on the power supply VDD1 needs to be delayed by a time τd from turning on the power supply VDD2. The period τd must satisfies 0<τd<T, where the time T is a constant which defined as a specification of the semiconductor device.

If the time T is too short, the power supply system is hard to be designed. Hence, the time T may be about several tens of μsec or more, e.g., 100 μsec.

The substrate potentials of the N-well 11 and P-well 12, i.e., potentials at the nodes n5 and n6 are controlled by the substrate bias circuit 13 or the transistors NM1 and MP1, as described above. When the transistors MN1, MP1, MN2, and MP2 are OFF, the substrate bias circuit 13 supplies the substrate bias voltage Vsub1 higher than the power supply voltage VDD1 to the N-well 11 and node n3, and the substrate bias voltage Vsub2 lower than the ground potential VSS to the P-well 12 and node n4. However, when the transistors NM1, MP1, MN2, and MP2 are ON, the N-well 11 and node n4 must be fixed at the power supply potential VDD2, and the P-well 12 and node n3 must be fixed at the ground potential VSS regardless of the substrate bias voltages generated by the substrate bias circuit 13. More specifically, the transistor sizes are selected such that the control by the transistors force the potentials of the walls 11 and 12 regardless of the output of the substrate bias generator.

The diodes D1 and D2 generate necessary potential differences between the gates and drains of the transistors MP1 and MN1 to completely turn them off when the transistors MN2 and MP2 are OFF and when the substrate bias voltages output from the substrate bias circuit 13 are applied to the wells 11 and 12.

The detailed internal arrangement and operation of the reset circuit 14 will be described below with reference to FIG. 2.

The reset circuit 14 generates signals (potentials at the nodes n1 and n2 in FIG. 1) for fixing the wells 11 and 12 at the power supply voltage VDD2 and the ground voltage VSS, respectively, for the predetermined period T after power-on. As an important feature of the reset circuit 14 according to the first embodiment, not the CR time constant defined by a resistor and a capacitor but an oscillator 21 and a counter 22 for counting the output clocks of the oscillator 21 are used to determine the predetermined period T. With this arrangement, the well 11 can be fixed at the power supply potential VDD2 and the well 12 at the ground potential VSS for the long period T that cannot be realized by the CR time constant provided by an on-chip capacitance/resistance.

When the CR time constant is used as in the prior art, a time of about 10 μsec is difficult because of the limited chip area. However, in the reset circuit 14 of this embodiment, when the frequency of the oscillator 21 and the number of stages of the counter 22 are appropriately designed, the period T of millisecond order can also be realized. The resistor R and the capacitor C shown in FIG. 2 are used not to define the time T but to only generate a signal for initializing the counter 22 and the flip-flop FF. The power supply voltage VDD2 operates all elements included in the reset circuit 14.

The reset circuit has the resistor R, capacitor C, inverters IN1 thorugh IN4, oscillator 21, counter 22, and D-flip-flop FF. Output 1 of the reset circuit is connected to the gate of the transistor MN2 through the node n1 shown in FIG. 1. Output 2 of the reset circuit is connected to the gate of the transistor MP2 through the node n2 shown in FIG. 1.

The resistor R and capacitor C are connected in series between the power supply voltage VDD2 terminal and the ground voltage VSS terminal. The signal at the intermediate node nrl is amplified by the two inverters IN1 and IN2 and output on the node nr2. The output signal is fed into the reset terminal of the counter circuit 22 and also fed into the reset terminal R of the flip-flop FF.

The counter 22 is a cyclic counter. When pulses are input from the oscillator 21, the counter 22 sequentially counts up. When the count value reaches N (N is an integer of 1 or more), it returns to zero, and then the counter 22 counts up again. Only when the count value reaches N, the logic level "1" corresponding to the power supply voltage VDD2 is output. With the combination of the counter 22 and oscillator 21, a pulse can be generated every N cycles of the output clocks from the oscillator 21.

The flip-flop FF stores the voltage of output 2. When the power supply VDD2 is turned on, the potential at the node nr2 is the ground voltage VSS. When this potential is fed into the reset terminal R to reset the flip-flop FF, data of logic "0" corresponding to the ground voltage VSS is held. Hence, the Q output from the flip-flop FF is at logic "0". Output 1 from the reset circuit is at logic "1", and its output 2 is a logic "0".

Figure 3:
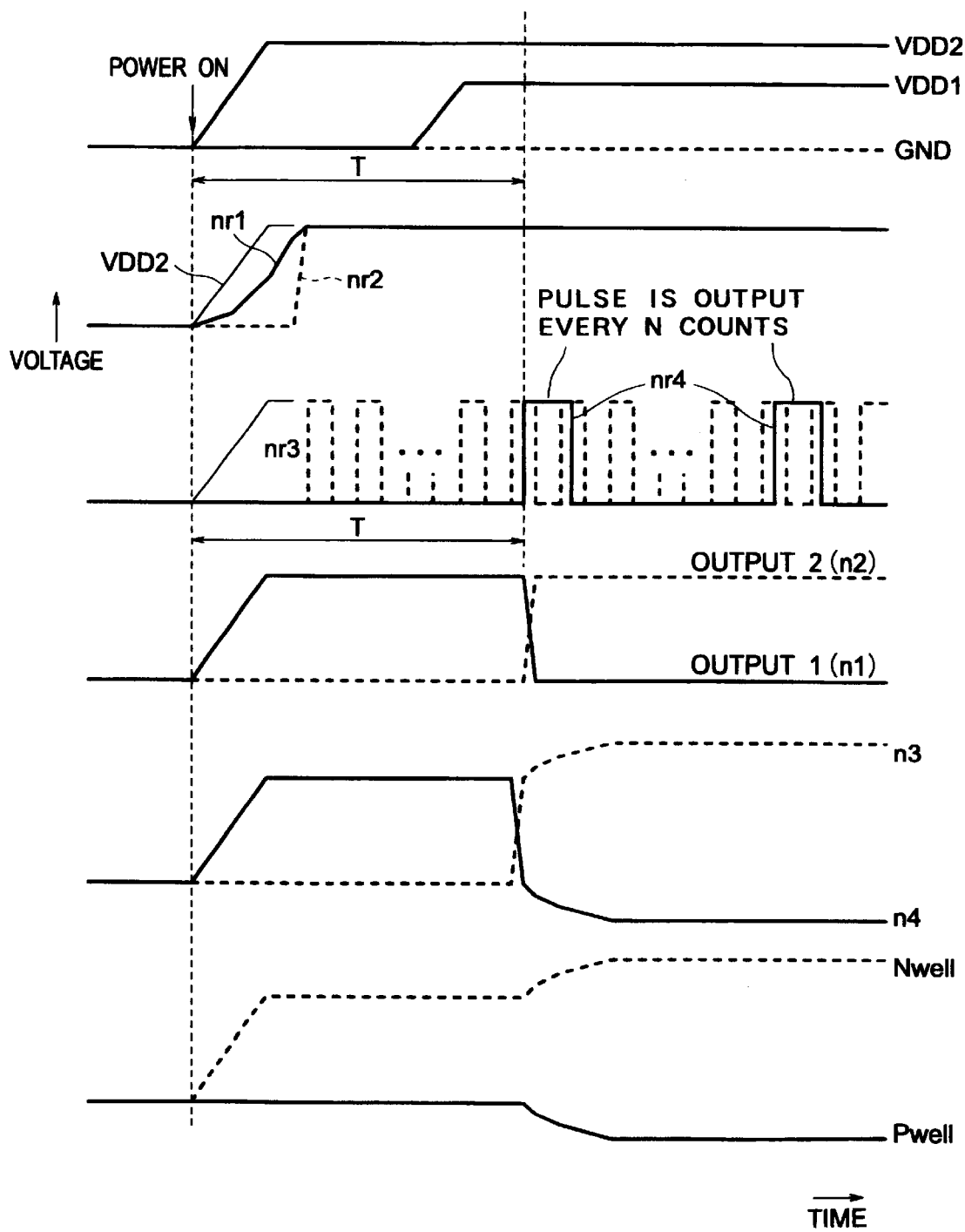
FIG. 3 is a timing chart showing a change in potential at each node in the semiconductor device according to the first embodiment.

The operation of this embodiment including the reset circuit 14 will be described with reference to FIG. 3 that shows the timing chart of the power supply potentials and the voltage waveforms of several nodes.

Figure 2:
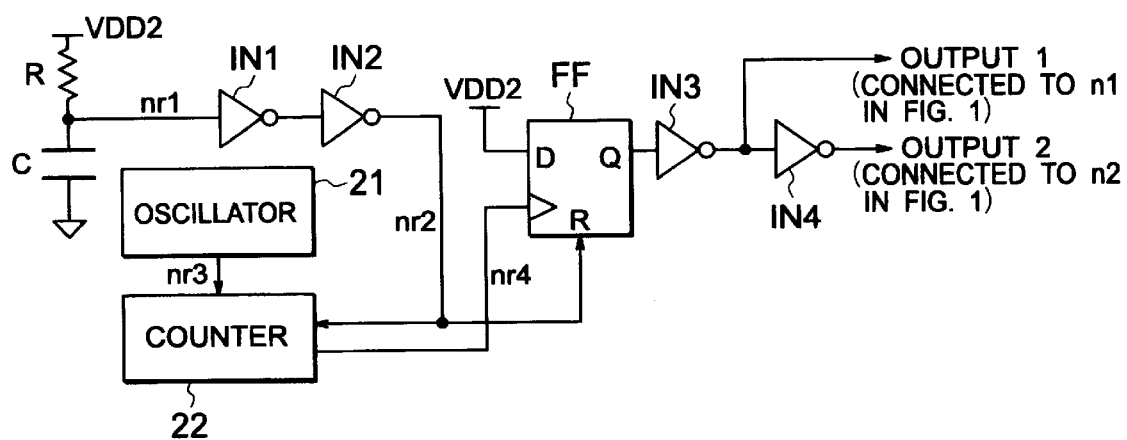
FIG. 2 is a circuit diagram showing an arrangement of the reset circuit in the semiconductor device according to the first embodiment.

Before the power supply VDD2 is turned on, the capacitive charges of all elements shown in FIG. 2 are discharged, and the potential at the node nr1 is the ground voltage VSS. The potential at the node n1 rises slightly later than the power supply voltage VDD2. The two inverters IN1 and IN2 amplify the potential at the node nr1. The potential at the node nr2 equals the ground voltage VSS for a while, and then, abruptly follows the power supply voltage VDD2.

When the node nr1 is at the ground voltage VSS, both the counter 22 and flip-flop FF are reset, so the internal data of the counter 22 is "0" and the initial data of the flip-flop FF is logic "0". As a result, output 1 from the reset circuit 14 is logic "1", and its output 2 is logic "0".

When the potential at the node nr2 reaches a certain level, the counter 22 starts counting up the clock supplied from the oscillator 21. When the count value reaches N, logic "1" is output form the output node nr4 of the counter 22. The pulse output from the output node nr4 is fed into the clock terminal of the flip-flop FF to renew the internal data to logic "1". Consequently the Q output from the flip-flop FF becomes at logic "1". Therefore output 1 inverts the output to logic "0" and its output 2 inverts the output to logic "1".

The output from the counter 22 returns to logic "0" in response to the (N+1) pulse. The counter 22 outputs a pulse of logic "1" every N cycles of the input data. However, the input terminal D of the flip-flop FF is fixed at the power supply voltage VDD2. Hence, the data stored in the flip-flop FF does not change anymore regardless of the output voltage from the counter 22. Hence, the potential of output 1 is at "1" at the onset of the power-on of the power supply VDD2. After the elapse of the predetermined time T, the potential changes to and stays at "0".

The potential of output 2 is at "0" at the onset of the power-on of the power supply VDD2. After the elapse of the predetermined time T, the potential changes to and stays at "1". When such outputs 1 and 2 are used as the gate voltages of the transistors MN2 and MP2, the transistors MN2 and MP2 are turned on immediately after the power supply VDD2 is turned on. Accordingly, the transistors NM1 and MP1 are also turned on. When the predetermined time T elapses, the transistors MN1, MN2, MP1, and MP2 are turned off and remain OFF. Hence, immediately after the power supply VDD2 is turned on, the potential of the well 11 is fixed at the power supply voltage VDD2, and that of the well 12 is fixed at the ground potential VSS. After the predetermined time T elapses, the substrate bias voltages Vsub1 and Vsub2 generated by the substrate bias circuit 13 are applied to the wells 11 and 12, respectively.

As described above, immediately after the power supply VDD2 is turned on, the power supply potential VDD2 does not stabilize, and therefore, the substrate bias circuit 13 cannot stably operate. When the power supply VDD1, which is delayed by the time τd from the onset of the power-on of the supply VDD2 is turned on, latch-up may occur. However, according to this embodiment, before the predetermined time T including the period τd elapses after the power supply VDD2 is turned on, the transistors MP1 and MN1 are controlled by the reset circuit 14 to fix the N-well 11 at the power supply potential VDD2 and the P-well 12 at the ground potential VSS. With this arrangement, latch-up can be avoided because the well potential is connected to appropriate voltages.

Arrangements in which only the reset circuit 14 is different from that of the first embodiment shown in FIG. 2 will be described below as the second to sixth embodiments of the present invention. The parts other than the reset circuit 14 are the same as in FIG. 1, and a detailed description thereof will be omitted.

Figure 4:
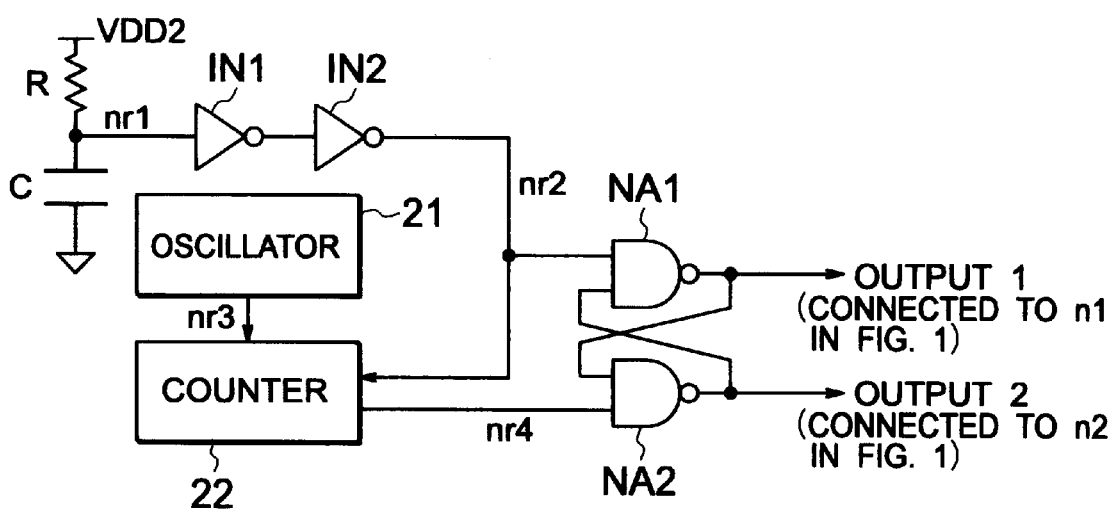
FIG. 4 is a circuit diagram showing an arrangement of the reset circuit in a semiconductor device according to the second embodiment.

FIG. 4 shows the arrangement of a reset circuit in a semiconductor device according to the second embodiment. The reset circuit of this embodiment uses an RS flip-flop which consists of two NAND gates NA1 and NA2, instead of the D-flip-flop FF in the reset circuit of the first embodiment.

A counter 22 comprises a cyclic counter for counting up to N, as in the first embodiment. The counter 22 sequentially counts up from zero. When the count value reaches N, it returns to zero and then the counter 22 counts up again.

When the reset input is "0", the internal data of the counter 22 remains reset to "0" and its output is reset to "1" and the counter 22 does not count up. When the reset input changes to "1", the counter 22 starts counting up the clock output from an oscillator 21. The counter 22 outputs a signal of "0" only when the internal data reaches the maximum value N. Otherwise, the counter 22 outputs a power supply potential VDD2. That is, the counter 22 can output a negative pulse every N cycles of output clocks from the oscillator 21.

Figure 5:
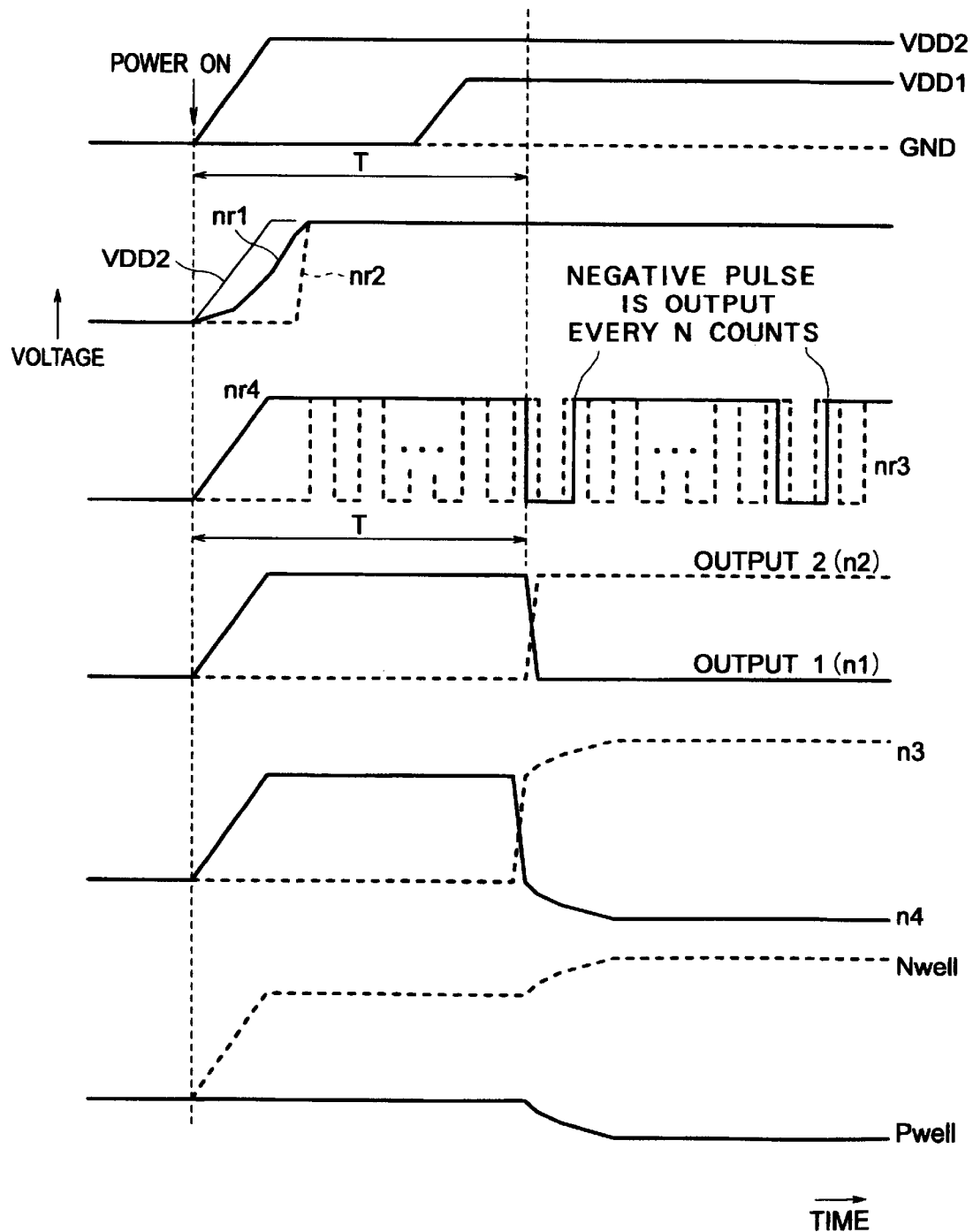
FIG. 5 is a timing chart showing a change in potential at each node in the semiconductor device according to the second embodiment.

FIG. 5 is a timing chart of the power supply voltages and voltage waveforms of several nodes. The intermediate node between a resistor R and capacitor C, which are connected in series between the power supply VDD2 and the ground potential VSS, is the node nr1. The signal at the node nr1 is amplified by two inverters IN1 and IN2 to the potential at the node nr2 and fed into the reset terminal of the counter 22 and one of the terminals of the RS flip-flop.

Immediately after the power supply VDD2 is turned on, the node nr2 is "0", and a node nr4 is at "1". For this reason, output 1 from the RS flip-flop is "1", and its output 2 is "0".

When the potential at the node nr2 rises, the RS flip-flop keeps output 1 at "1" and output 2 at "0". Since the reset of the counter 22 become VDD2, the counter 22 starts counting up. When the Nth pulse is counted, the output node nr4 of the counter 22 changes from "1" to "0". Hence, output 1 from the RS flip-flop changes to "0", and its output 2 changes to "1".

The output from the counter 22 is set at "1" again in response to the (N+1)the pulse. Every N count of the clock, the counter 22 outputs the signal of "0". However, the state of the RS flip-flop does not change. For this reason, the data stored in the RS flip-flop does not change anymore regardless of the output voltage from the counter 22.

Immediately after the power supply VDD2 is turned on, the potential of output 1 is at "1". After the predetermined time T elapses, the potential changes to and stays at "0". Immediately after the power supply VDD2 is turned on, the potential of output 2 is at "0". After the predetermined time T elapses, the potential changes to and stays at "1". When the outputs 1 and 2 are used as the gate voltages of transistors MN2 and MP2 shown in FIG. 1, immediately after power-on, the transistors MN2 and MP2 are turned on and the transistors MN1 and MP2 are also turned on. After the predetermined time T elapses, all the transistors MN1, MN2, MP1, and MP2 are turned off and remain OFF.

As described above, according to the first and second embodiments, the substrate potential is fixed at the power supply potential VDD2 or ground potential VSS immediately after the power-on. After the elapse of the predetermined time T, the substrate bias voltages generated by the substrate bias circuit 13 are applied via diodes D1 and D2. At this time, a voltage higher than the voltage at the N-well 11 by the forward bias voltage of the diode D1 is applied to the gate of the transistor MP1. A voltage lower than the voltage at a P-well 12 by the forward bias voltage of the diode D2 is applied to the gate of the transistor MN1. Hence, the transistors MP1 and NM1 maintain the OFF state.

In the first and second embodiments, even after the elapse of the predetermined time T, the oscillator 21 and counter 22 still operate. In general, in a device using a substrate bias circuit, applying a substrate bias voltage to the substrate, aims at reducing the leakage current in the stand-by state. Hence, if the oscillator 21 and counter 22 operate during only a necessary period, the leakage current can be more effectively reduced.

In the third through sixth embodiments which take this point into consideration, the oscillation of the oscillator 21 used to determine the predetermined time T is stopped, thereby suppressing excess power consumption.

Figure 6:
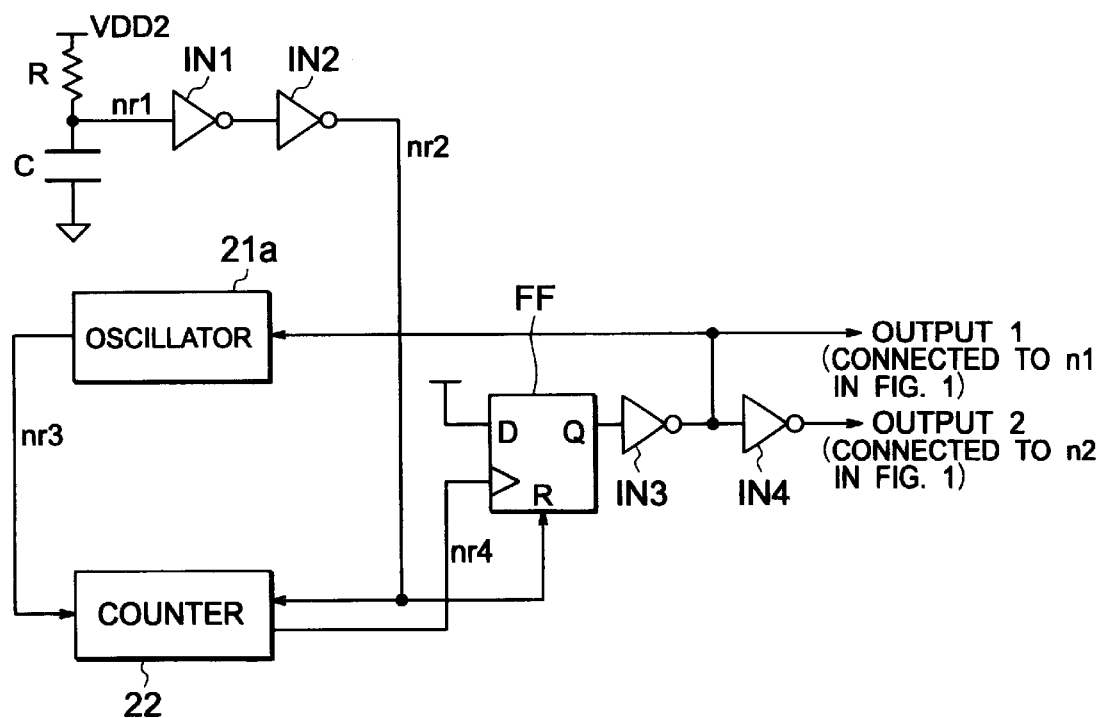
FIG. 6 is a circuit diagram showing an arrangement of the reset circuit in a semiconductor device according to the third embodiment.

FIG. 6 shows the arrangement of a reset circuit according to the third embodiment. The parts other than the reset circuit are the same as in the first and the second embodiments, and a detailed description thereof will be omitted. As an important feature of the third embodiment, an oscillator 21a has an enable terminal into which output 1 is fed as the enable signal. The oscillator 21a does not oscillate when the enable signal is "0", and starts oscillating when the enable signal changes to "1". The operation of the third embodiment is almost the same as that of the fourth embodiment (to be described next). The operations of the third and fourth embodiments will be described together with reference to a timing chart common to the third and fourth embodiments.

Figure 7:
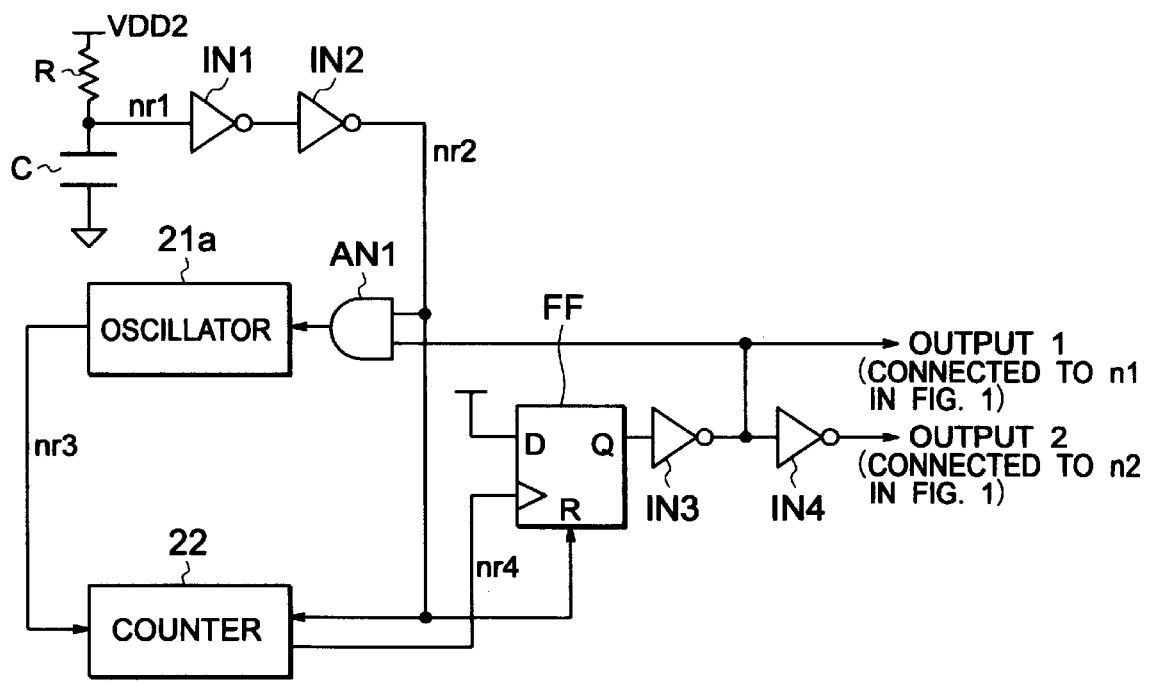
FIG. 7 is a circuit diagram showing an arrangement of a reset circuit in a semiconductor device according to the fourth embodiment.

A semiconductor device according to the fourth embodiment of the present invention has a reset circuit having an arrangement shown in FIG. 7.

The fourth embodiment is different from the third embodiment in that the enable signal for an oscillator 21a is generated by the AND logic of the node nr2 and output 1 using an AND gate AN1. With this arrangement, the oscillator 21a and a counter 22 can simultaneously start operating immediately after power-on.

Figure 8:
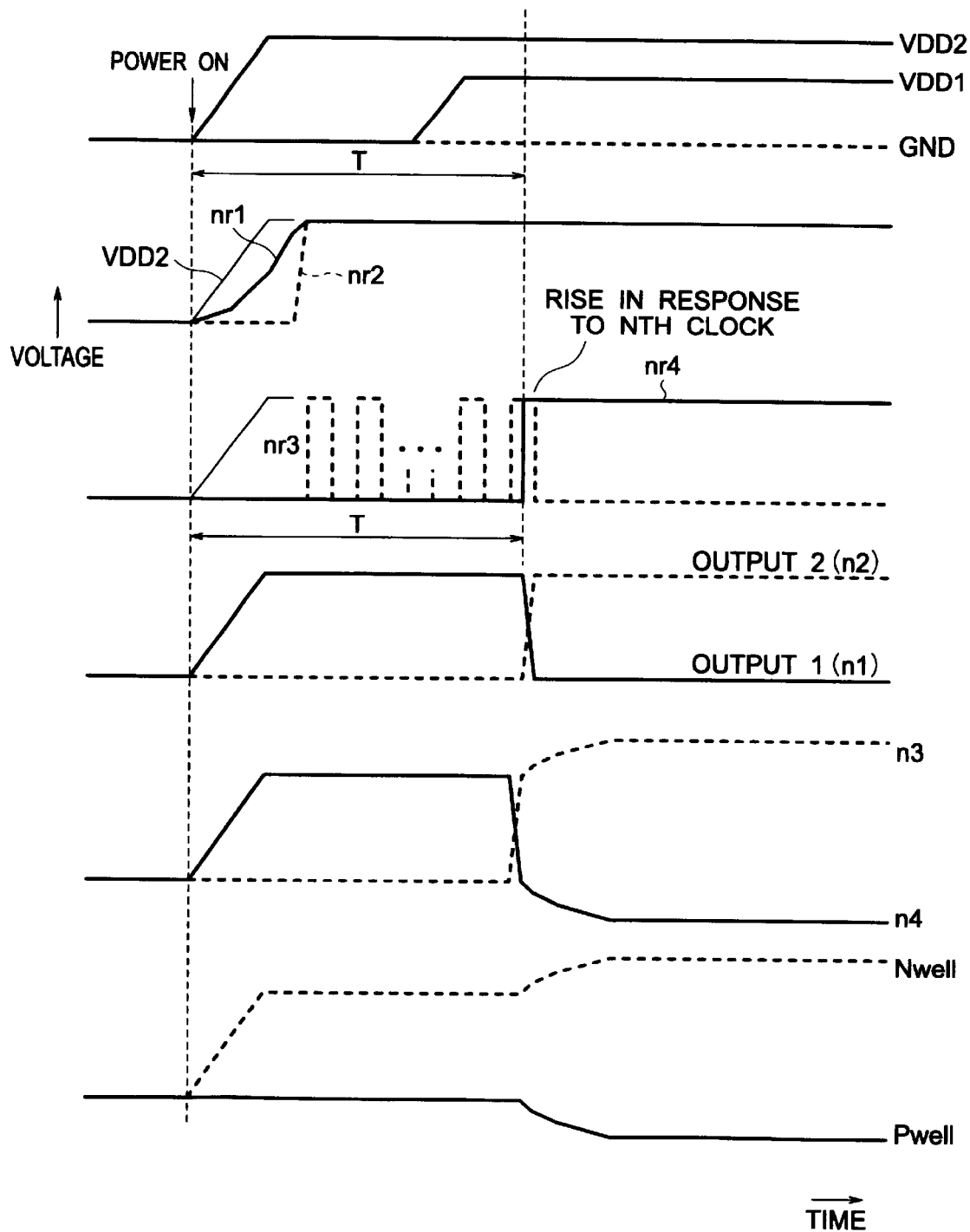
FIG. 8 is a timing chart showing a change in potential at each node in the semiconductor devices according to the third and fourth embodiments.

FIG. 8 is a timing chart showing the power supply potentials and voltage waveforms of several nodes in the third and fourth embodiments. The intermediate node between a resistor R and capacitor C, which are connected in series between the power supply VDD2 and the ground potential VSS is the node nr1. The potential at the node nr1 is amplified by two inverters IN1 and IN2 to the potential at the node nr2 and fed into the counter 22 and the reset terminal of a flip-flop FF. The counter 22 comprises a cyclic counter for counting up to N, as in the first and the second embodiments. The counter 22 sequentially counts up from zero. When the count value reaches N, it returns to zero and then the counter 22 counts up again. When the reset input is "0", the internal data and output from the counter 22 is reset to "0" and the counter 22 does not count up. When the reset input changes to "1", the counter 22 starts counting up the clock output from the oscillator 21a. The counter 22 outputs a signal of "1" only when the internal data reaches the maximum value N. That is, the counter 22 can output a pulse every N cycles of output clocks from the oscillator 21a.

When the power supply VDD2 is turned on, the flip-flop FF is reset and holds "0". That is, immediately after power-on, output 1 is at "1", and output 2 is at "0". When the potential at the node nr2 rises, the counter 22 starts counting up. When the Nth pulse is counted, the potential at an output node nr4 of the counter 22 changes from "0" to "1". The flip-flop FF is triggered to renew the internal data to "1".

Consequently, output 1 changes to "0", and output 2 changes to "1". At this time, the enable signal for the oscillator 21a changes to "0", and the oscillator 21a stops oscillating. Accordingly, the counter 22 also stops counting. Hence, the reset circuit consumes only slight power due to the leakage current.

Both the third and fourth embodiments are the modifications of the first embodiment. Since the enable signal is supplied to the oscillator 21a, and the operations of the oscillator 21a and counter 22 are stopped after reset is ended, excess power consumption can be suppressed. In the second embodiment as well, when the enable signal is equipped on the oscillator, the operations of the oscillator and the counter can be stopped to suppress excess power consumption. This arrangement will be described below as the fifth and sixth embodiments of the present invention.

Figure 9:
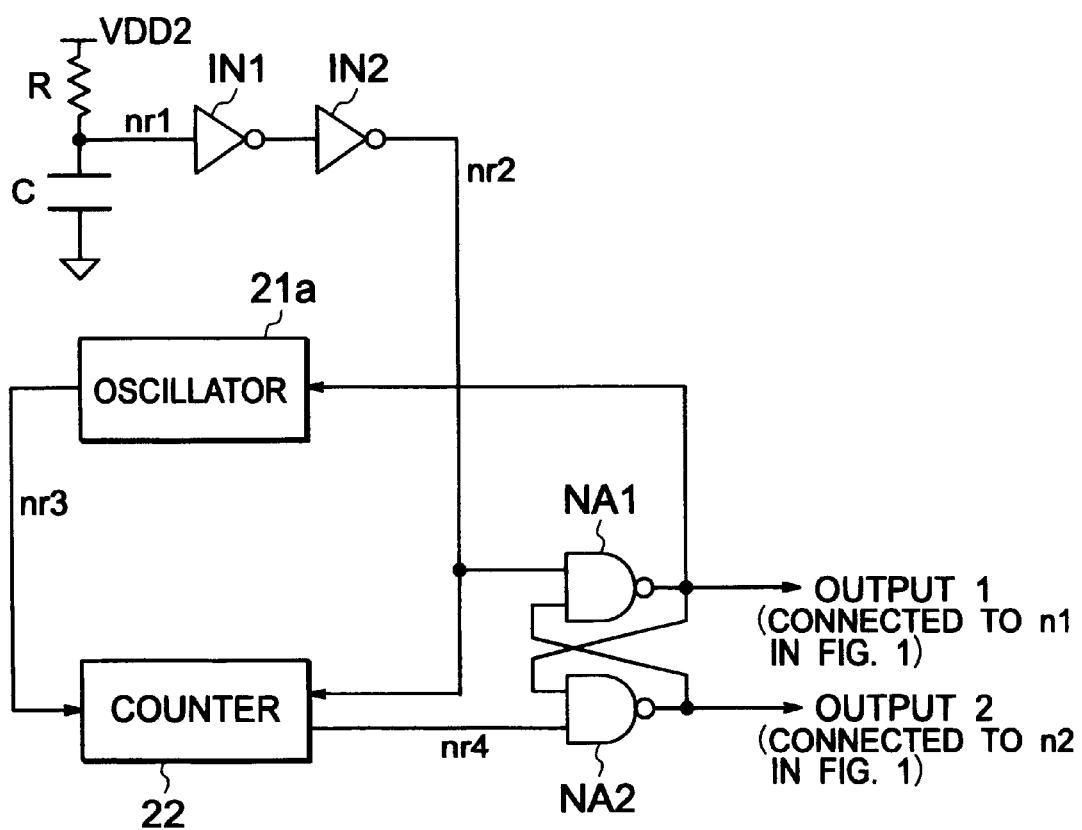
FIG. 9 is a circuit diagram showing an arrangement of the reset circuit in a semiconductor device according to the fifth embodiment.

FIG. 9 shows the arrangement of a reset circuit according to the fifth embodiment. The parts other than the reset circuit are the same as in the first to fourth embodiments. As an important feature of the fifth embodiment, an oscillator 21a has an enable terminal into which output 1 is fed as the enable signal, as in the third and the fourth embodiments. The oscillator 21a does not oscillate when the enable signal is "0", and starts oscillating when the enable signal changes to "1". The operation of the fifth embodiment is almost the same as that of the sixth embodiment (to be described next). The operations of the fifth and the sixth embodiments will be described together with reference to a timing chart common to the fifth and sixth embodiments.

Figure 10:
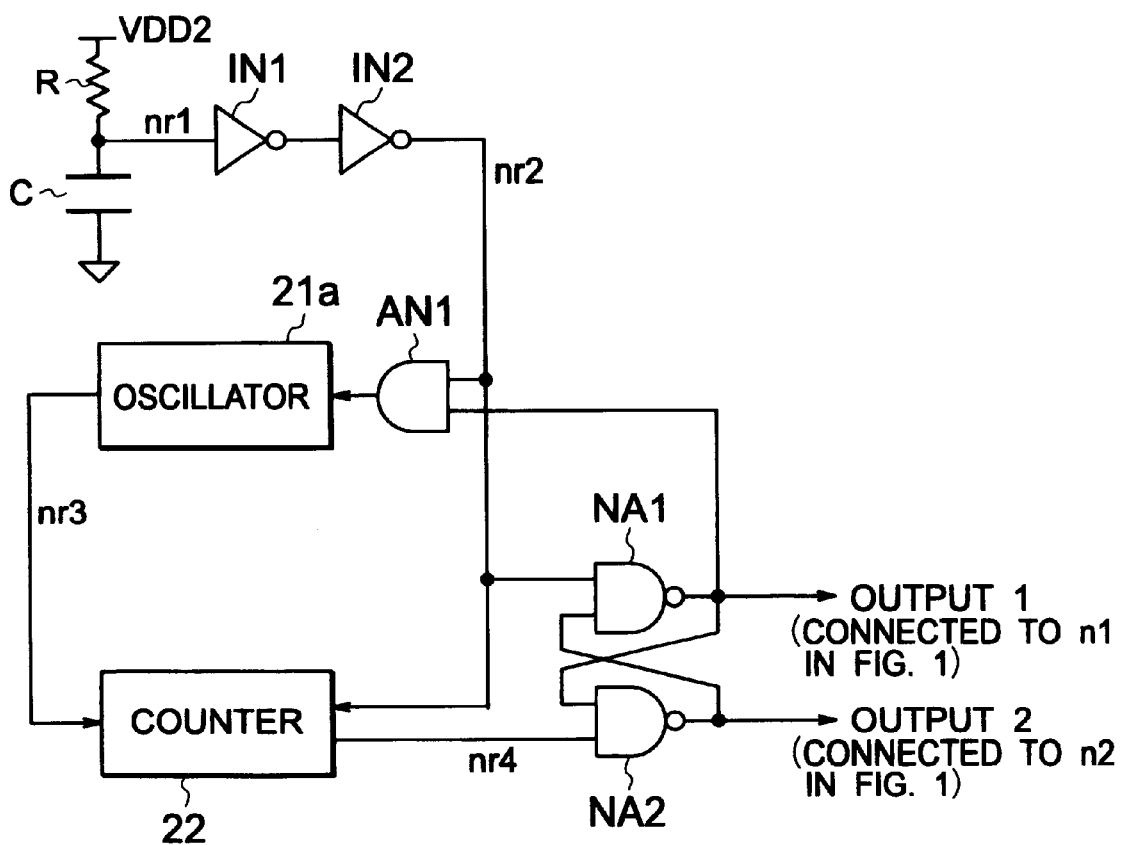
FIG. 10 is a circuit diagram showing an arrangement of the reset circuit in a semiconductor device according to the sixth embodiment.

A semiconductor device according to the sixth embodiment has a reset circuit having an arrangement shown in FIG. 10.

The sixth embodiment is different from the fifth embodiment in that the enable signal for an oscillator 21a is generated by and AND logic of a node nr2 and output 1 using an AND gate AN1. With this arrangement, the oscillator 21a and a counter 22 can simultaneously start operating immediately after power-on.

Figure 11:
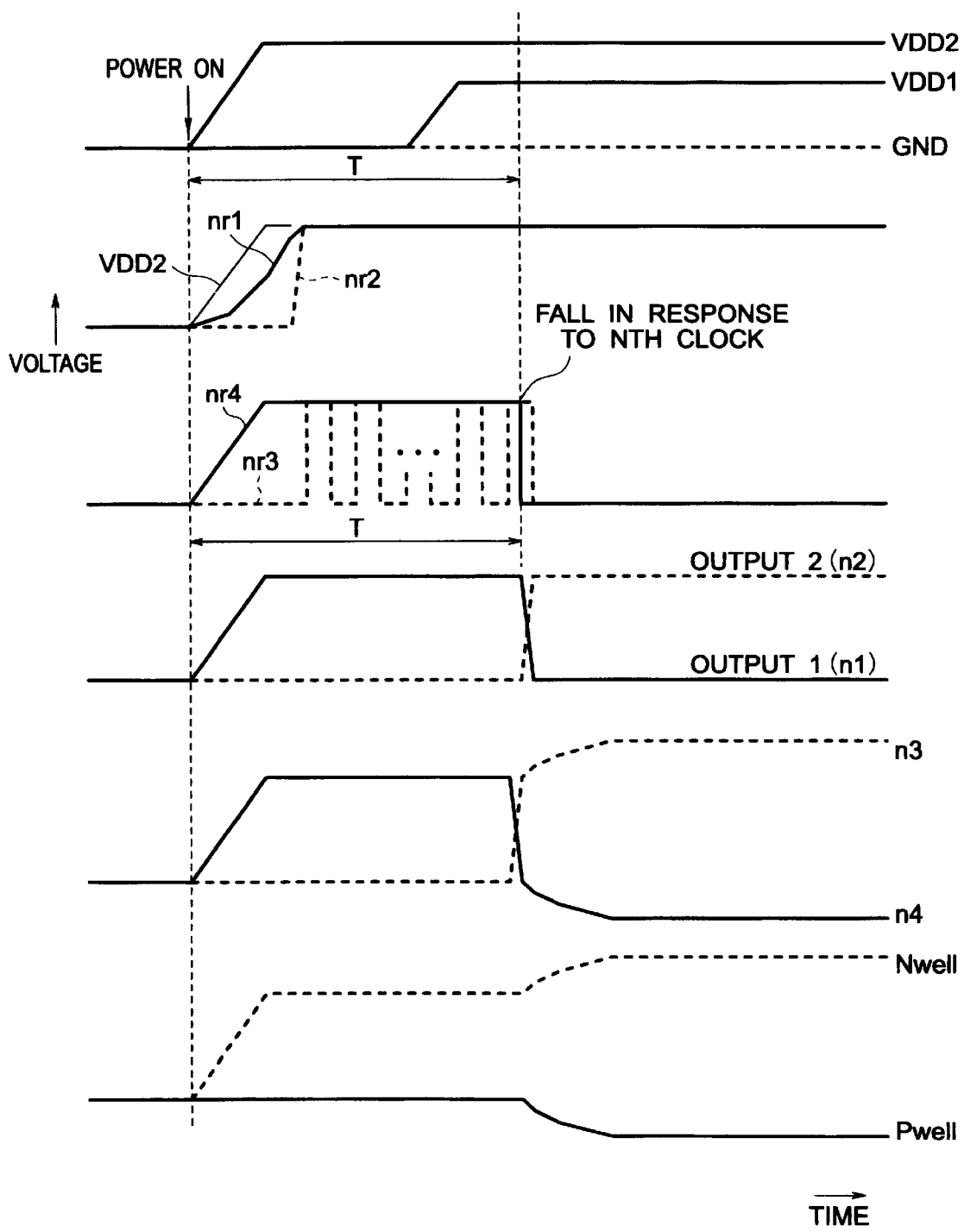
FIG. 11 is a timing chart showing a change in potential at each node in the semiconductor devices according to the fifth and sixth embodiments.

FIG. 11 is a timing chart showing the power supply potentials and voltage waveforms of several nodes in the fifth and sixth embodiments. The intermediate node between a resistor R and capacitor C, which are connected in series between the power supply VDD2 and the ground VSS, is the node nr1. The potential at the node nr1 is amplified by two inverters IN1 and IN2 to the potential at the node nr2 and fed into the reset terminate of the counter 22 and the reset terminal of a flip-flop FF. The counter 22 comprises a cyclic counter for counting up to N, as in the first and second embodiments. The counter 22 sequentially counts up from zero. When the count value reaches N, it returns to zero and then the counter 22 counts up again. When the reset input is at "0", the internal data is reset to "0" and its output remains reset to "1" and the counter 22 does not count up. When the reset input changes to "1", the counter 22 starts counting up the clock output from the oscillator 21a. The counter 22 outputs the signal of "0" only when the internal data reaches the maximum value N. With this arrangement, the counter 22 can generate a negative pulse every N cycles of output clocks from the oscillator 21a.

Immediately after the power supply VDD2 is turned on, the node nr2 is "0", and a node nr4 is "1". For this reason, output 1 from the RS flip-flop is "1", and its output 2 is "0". When the potential at the node nr2 rises, the RS flip-flop holds its data, so output 1 is kept a "1" and output 2 is kept at "0". At the same time, counter 22 starts counting up. When the Nth pulse is counted, the output node nr4 of the counter 22 changes from "1" to "0". Hence, output 1 from the RS flip-flop changes to "0", and its output 2 changes to "1". At this time, the enable signal for the oscillator 21a changes to "0", and the oscillator 21a stops oscillating. Accordingly, the counter 22 also stops counting. Hence, the reset circuit consumes only slight power due to the leakage current.

Figure 12:
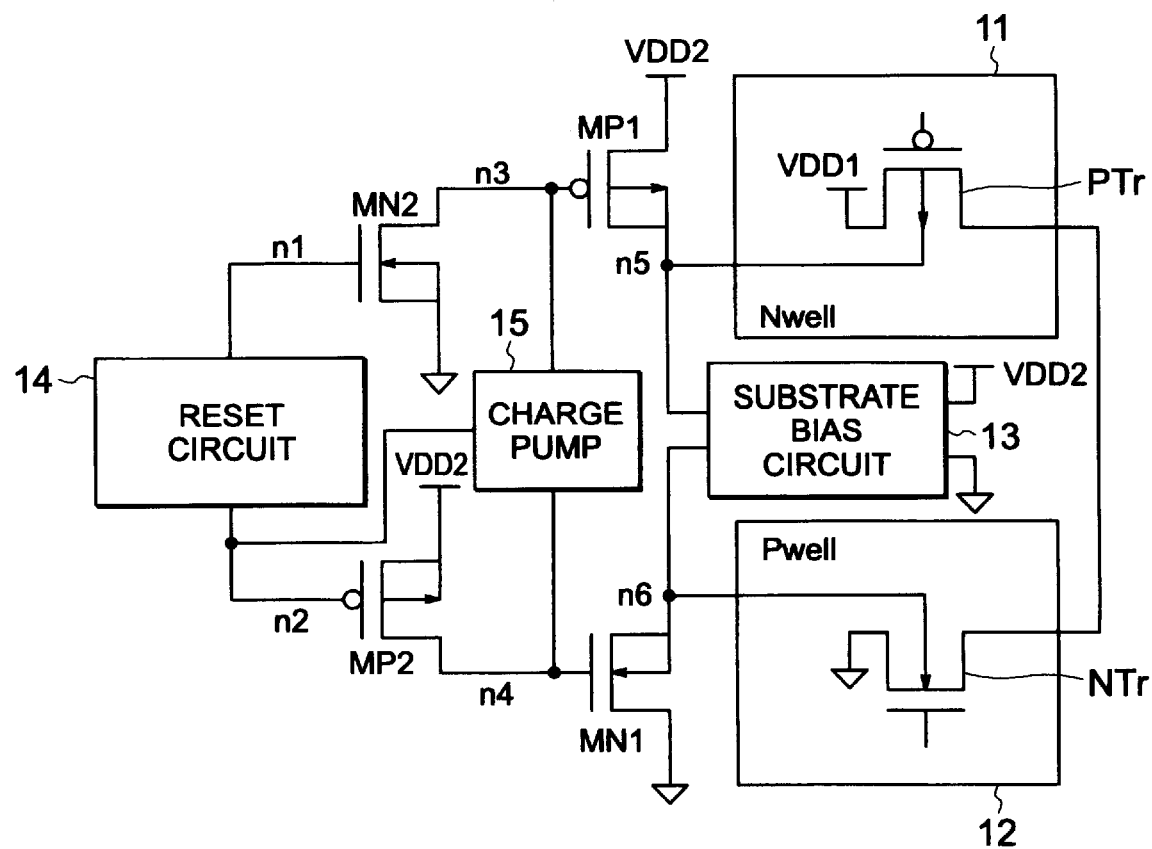
FIG. 12 is a circuit diagram showing the arrangement of a semiconductor device according to the seventh embodiment of the present invention.

In the above-described first to sixth embodiments, the overall arrangement of the device is the same as in FIG. 1. A device according to the seventh embodiment of the present invention (to be described below) has an overall arrangement as shown in FIG. 12.

As an important feature of this embodiment, a substrate bias circuit 13 and a circuit for controlling the gate voltages of transistors MP1 and MN1 separated.

More specifically, unlike the first to sixth embodiments, diodes D1 and D2 are omitted to short-circuit the two output terminals of the substrate bias circuit 13 to nodes n5 and n6, respectively. Instead, a charge pump 15 is used to control the gate voltages of the transistor MP1 and MN1. The operation state of the charge pump 15 is controlled upon receiving, as an enable signal, the potential at an output node n2 of a reset circuit 14. The charge pump 15 controls the potentials at nodes n3 and n4.

In this case, the potentials at the nodes n1 through n4 and the potentials at an N-well 11 and a P-well 12 change as in the first thorugh sixth embodiments. Until a predetermined time T elapses after turning on a power supply VDD2, the output node n1 of the reset circuit 14 is the power supply voltage VDD2, the output node n2 is the ground voltage VSS, and transistors MN2 and MP2 are turned on. Since the node n2 is at the ground voltage VSS, the charge pump 15 which receives this potential as the enable signal is disabled, and the outputs from the charge pump 15 are in a high-impedance state. Hence, the potentials at the nodes n3 and n4 are determined by the transistors MN2 and MP2. The node n3 is at the ground voltage VSS, the node n4 is at the power supply voltage VDD2, and the transistors MP1 and MN1 are turned on.

While all the transistors MN2, MP2, MP1, and MN1 are ON, the N-well 11 and a node n5 are fixed at the power supply voltage VDD2, and the P-well 12 and a node n6 are fixed at the ground voltage VSS, regardless of the substrate bias voltages Vsub1 and Vsub2 generated by the substrate bias circuit 13.

In this way, before the predetermined time T elapses, all the transistors MN2, MP2, MP1, and MN1 are ON, the N-well 11 is fixed at the power supply voltage VDD2, and the P-well 12 is fixed at the ground voltage VSS.

After the predetermined time T elapses, the potential at the output node n1 of the reset circuit 14 changes to the ground voltage VSS, the potential at the output node n2 changes to the power supply voltage VDD2, and the transistors MN2 and MP2 are turned off. Since the enable signal becomes the power supply voltage VDD2, the charge pump 15 operates. The potential at the node n3 to which one output node of the charge pump 15 is connected rises above the substrate voltage Vsub1 higher than the power supply voltage VDD1. On the other hand, the potential at the node n4 to which the other output node is connected drops below the substrate voltage Vsub2 lower than the ground voltage VSS.

After the predetermined time T elapses, the potentials at the nodes n3 and n4 are determined by the outputs from the charge pump 15. The transistors MP1 and MN1 are turned off. As a consequence, the substrate bias voltage Vsub1 output from the substrate potential generation circuit 13 is applied to the N-well 11, and the substrate bias voltage Vsub2 is applied to the P-well node 12.

As described above, in this embodiment, the charge pump 15 has the enable terminal connected to the node n2. When the transistors MN2 and MP2 are turned ON by this enable signal, the charge pump 15 stop operating. When the transistors are OFF, the charge pump 15 operates. Unlike the arrangement shown in FIG. 1, when the transistors MN2 and MP2 are ON, the outputs from the substrate bias circuit 13 and the drain outputs from the transistors MN2 and MP2 do not collide at the gates of the transistors MN1 and MP1. For this reason, the size of the transistors MN2 and MP2 can be reduced.

An example of the oscillator used in the reset circuit 14 will be described next. The oscillators 21 and 21a used in the first to sixth embodiments can be effectively oscillated at a low frequency of several MHz or less. This is because a counter with a small number of stages can be used to realize a reset period T of the msec order.

Figure 13A:
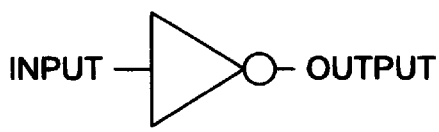
FIGS. 13A and 13B are explanatory figures showing problems posed when inverters without a Schmitt trigger function are used as the inverters in the oscillator in the reset circuit of each of the semiconductor devices according to the first through the seventh embodiments.
Figure 13B:
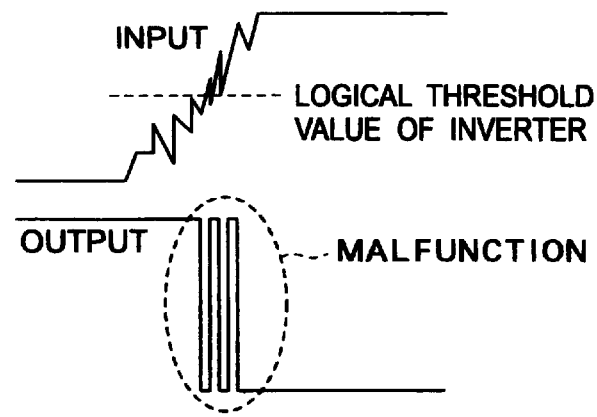

However, oscillation at a low frequency moderates the rising slope and the falling slope of the input waveform to the inverter, as shown in FIG. 13B. For this reason, the oscillator is easily influenced by the noise in the input waveform and may oscillate the output at a frequency much higher than the original frequency. When such outputs are input to the counter, these pulses are miscounted as original clocks. This causes an operation error wherein the reset state is finished in a time much shorter than the predetermined time T.

Figure 14:
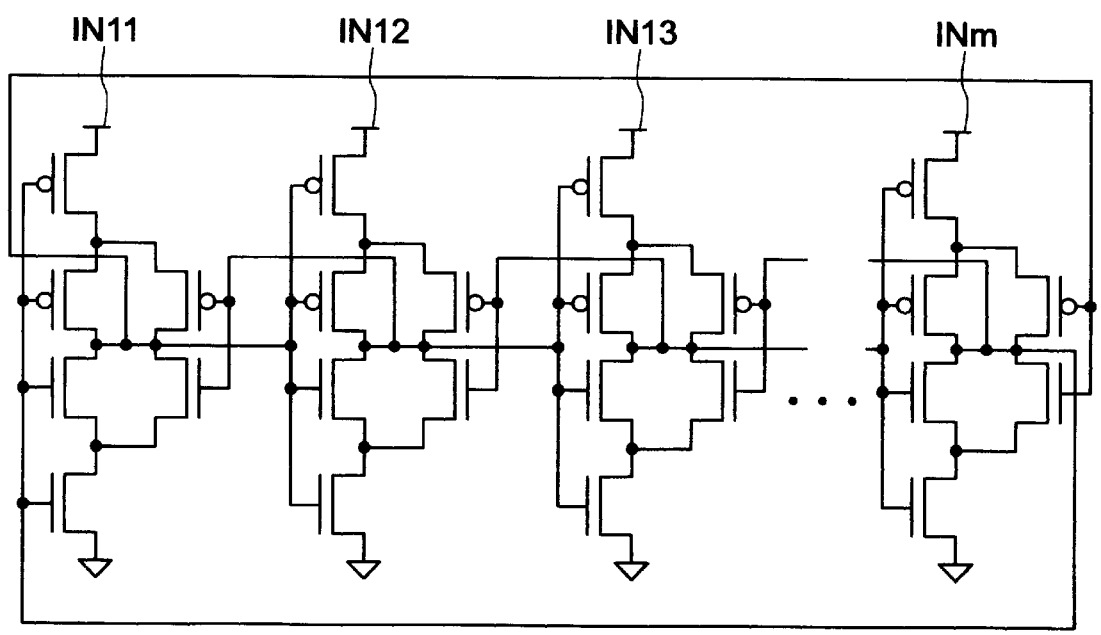
FIG. 14 is a circuit diagram showing a ring oscillator constructed by using inverters with a Schmitt trigger function, as an example of the oscillator in the reset circuit of each of the semiconductor devices according to the first through seventh embodiments.

To prevent this phenomenon, a ring oscillator is preferably constructed using inverters IN11 to INm (m is an odd number of 3 or more) with a Schmitt trigger function, as shown in FIG. 14. An inverter with a Schmitt trigger function has different threshold values for the rise and the fall of an input waveform. That is, the inverter has hysteresis characteristics in which the input level when the output changes from low level to high level is different from that when the output changes from high level to low level. With the use of such inverters, even when noise is superimposed on the signal waveform of each element, any error in the operation of counting the predetermined time T can be avoided.

The above-described embodiments are merely examples, and the present invention is not limited to these embodiments. The circuit arrangements of the first to seventh embodiments are examples, and various changes and modifications can be made as needed. For example, the reset circuit in each of the first to seventh embodiments counts the number of clocks to measure the predetermined time T. However, the present invention is not limited to this. After power-on, the reset circuit may start monitoring the power supply voltage and detect that the level of the power supply voltage is sufficiently stable thereby measuring the predetermined time.

What is claimed is:

1. A semiconductor device comprising;
a plurality of semiconductor areas in which at least one MOSFET is formed respectively, a source of each MOSFET is connected to at least one of the two power supplies or the ground potential;
a circuit for connecting each of the plurality of semiconductor areas, in accordance with a conductivity type of the each area, to a highest power supply potential of the at least two power supply potentials or the ground potential respectively, during a predetermined period of time which starts when the highest power supply potential is first turned on and which ends when the rest of the power supplies are turned on and all the power supplies become stable.

2. A device according to claim 1, further comprising:
a substrate bias circuit generating a first substrate bias voltage higher than each of the power supply potentials being fed to each MOSFET and a second substrate bias voltage lower than the ground potential; and
a circuit for applying the first substrate bias voltage or the second substrate bias voltage to each of the semiconductor areas in accordance with a conductivity type of the semiconductor area after the predetermined period.

3. A device according to claim 2, wherein
the highest power supply potential applied to the substrate bias circuit,
and the predetermined period includes a period after between a power supply of the highest power supply potential being turned on and all remaining power supplies having been turned on and come to a stable state.

4. A device according to claim 1, further comprising:
a reset circuit for measuring the predetermined period, wherein the reset circuit comprises
an oscillator to output a clock signal, a counter to start counting the clock signal when one of the power supply potentials is first turned on, and outputs a notification signal when a count value reaches a maximum value and a data holding circuit to change its output upon receiving the notification signal.

5. A device according to claim 4, wherein
the oscillator has an enable terminal connected to the output of the data holding circuit and the oscillator stops oscillating when the output of the data holding circuit changes.

6. A device according to claim 4, wherein
the oscillator comprises a ring oscillator in which an odd number of inverters with a Schmitt trigger function are connected serially.

7. A device according to claim 4, wherein
the potential control circuit comprises at least one switching element, and
the reset circuit generates control signals turning on the switching element during the predetermined period and turning off the switching element after the predetermined period.

8. A semiconductor device comprising:
a first n-type semiconductor area including at least one first PMOS transistor having a terminal connected to a first power supply potential;
a second n-type semiconductor area including at least one second PMOS transistor having a terminal connected to a second power supply potential;
a p-type semiconductor area including at least one NMOS transistor having a terminal connected to a ground potential;
a substrate bias circuit for outputting a first substrate bias voltage to the first n-type semiconductor area and outputting a second substrate bias voltage to the p-type semiconductor area, the first substrate bias voltage being higher than both the first and the second power supply potentials, and the second substrate bias voltage being lower than the ground potential;
a first switching element for applying a higher one of at least two power supply potentials or applying the first substrate bias voltage in accordance with a first control signal;
a second switching element for applying the ground potential or the second substrate bias voltage in accordance with a second control signal; and
a reset circuit for generating the first control signal and the second control signal.

9. A device according to claim 8, wherein the reset circuit comprises;
the first control signal causes the first switching elements to output higher one of at least two power supply potentials during a predetermined period between i) a power supply of the highest power supply potential being turned on and ii) all remaining power supplies having been turned on and come to a stable state and to output the first bias voltage after the predetermined period;
the second control signal causes the second switching element to output the ground potential during the predetermined period and to output the second bias voltage after the predetermined period.

10. A device according to claim 9, wherein the reset circuit comprises;
an oscillator for outputting clock signal;
a counter to start counting the clock signal when one of the power supply potentials which is turned on first, and outputs a notification signal when a count value reaches a maximum value; and
a data holding circuit to change its output upon receiving the notification signal;
whereby the reset circuit measures the predetermined period.

11. A device according to claim 10, wherein
the first switching element comprises;
a first diode connected between the substrate bias circuit and the first n-type semiconductor area;
a first switching PMOS transistor connected between the higher one of at least two power supply potentials and the first n-type semiconductor area; and
a first switching NMOS transistor connected between the higher one of at least two power supply potentials and the ground potential,
the second switching element comprises;
a second diode connected between the substrate bias circuit and the p-type semiconductor area;
a second switching NMOS transistor connected between the ground potential and the p-type semiconductor area; and
a second switching PMOS transistor connected between the higher one of at least two power supply potentials and the ground potential.

12. A device according to claim 11, wherein
the oscillator has an enable terminal connected to the output of the data holding circuit and the oscillator stops oscillating when the output of the data holding circuit changes.

13. A device to claim 11, wherein
the oscillator comprises a ring oscillator in which an odd number of inverters with a Schmitt trigger function are connected serially.

14. A device according claim 10, wherein
the first switching element comprises;
a first switching PMOS transistor connected between the higher one of at least two power supply potentials and the first n-type semiconductor area; and
a first switching NMOS transistor connected between the higher one of at least two power supply potential and the ground potential,
the second switching element comprises;
the second switching NMOS transistor connected between the ground potential and the p-type semiconductor area;
a second switching PMOS transistor connected between the higher one of at least two power supply potentials and the ground potential; and
a charge pump whose operation is controlled by the reset circuit and which is connected to a gate of the first switching PMOS transistor and a gate of the second switching NMOS transistor.

15. A device according to claim 11, wherein
the oscillator has an enable terminal connected to the output of the data holding circuit and the oscillator stops oscillating when the output of the data holding circuit changes.

16. A device according to claim 14, wherein
the oscillator comprises a ring oscillator in which an odd number of inverters with a Schmitt trigger function are connected serially.

17. A device according to claim 8, wherein
The first and the second n-type semiconductor area are a same n-type semiconductor area.

18. A semiconductor device comprising:
a plurality of semiconductor area in which at least one MOSFET is formed in each respective area, a source of each MOSFET is connected to at least one of two power supplies or a ground potential;
a circuit for connecting each of the plurality of semiconductor areas, in accordance with a conductivity type of each area, to a highest power supply potential of the at least two power supply potentials or the ground potential, respectively, during a predetermined period of time which starts when the highest power supply potentials is first turned on and which ends when the predetermined time has passed.

* * * * *